(12) United States Patent
Shang et al.

(10) Patent No.: US 11,949,415 B2
(45) Date of Patent: Apr. 2, 2024

(54) LOGIC OPERATION CIRCUIT FOR COMPUTATION IN MEMORY

(71) Applicant: Nanjing Institute of Intelligent Technology, Jiangsu (CN)

(72) Inventors: Delong Shang, Jiangsu (CN); Yeye Zhang, Jiangsu (CN); Qingyang Zeng, Jiangsu (CN); Shushan Qiao, Jiangsu (CN); Yumei Zhou, Jiangsu (CN)

(73) Assignee: Nanjing Institute of Intelligent Technology, Nanjing (CN)

( * ) Notice: Subject to any disclaimer, the term of this patent is extended or adjusted under 35 U.S.C. 154(b) by 168 days.

(21) Appl. No.: 17/534,805

(22) Filed: Nov. 24, 2021

(65) Prior Publication Data

US 2022/0337252 A1   Oct. 20, 2022

(30) Foreign Application Priority Data

Apr. 20, 2021   (CN) .......................... 202110421262.5

(51) Int. Cl.
| | | |
|---|---|---|
| *G11C 7/10* | (2006.01) | |
| *G11C 13/00* | (2006.01) | |
| *H03K 19/0944* | (2006.01) | |
| *H03K 19/20* | (2006.01) | |

(52) U.S. Cl.
CPC ............. *H03K 19/20* (2013.01); *G11C 7/106* (2013.01); *G11C 13/0002* (2013.01); *H03K 19/0944* (2013.01); *G11C 13/0028* (2013.01)

(58) Field of Classification Search
CPC ................................. G11C 7/106; H03K 19/20
See application file for complete search history.

(56) References Cited

U.S. PATENT DOCUMENTS 5,978,275 A * 11/1999 Song ...................... G11C 16/16
365/185.11

OTHER PUBLICATIONS

Rodoni et al. "Ultrafast CMOS inverter with 4.7 ps gate delay fabricated on 90 nm SOI technology," Electronics Letters vol. 40 No. 20 (Year: 2004).*

* cited by examiner

*Primary Examiner* — Alfredo Bermudez Lozada
(74) *Attorney, Agent, or Firm* — CALDERON SAFRAN & COLE P.C.; Corinne Marie Pouliquen

(57) ABSTRACT

The present disclosure relates to a logic operation circuit for computation in memory, which comprises an equivalent circuit input terminal, a reference circuit input terminal, a reset input terminal and an output terminal; wherein the equivalent circuit input terminal is configured to input the equivalent voltage of a memory computing array, the reset input terminal is configured to input a reset voltage, and the reference circuit input terminal is configured to input a reference voltage; the logic operation circuit for computation in memory outputs different output voltages according to the difference between the equivalent voltage and the reference voltage, and the output voltage is output through the output terminal; the logic operation circuit of the present disclosure has a simple structure, reduced complexity and effectively saved resources.

6 Claims, 4 Drawing Sheets

| input | | AND | OR |
|---|---|---|---|
| $R_{P,P}$ | ('0','0') | 0 | 0 |
| $R_{P,AP}$ | ('0','1') | 0 | 1 |
| $R_{AP,P}$ | ('1','0') | 0 | 1 |
| $R_{AP,AP}$ | ('1','1') | 1 | 1 |

LOGIC OPERATION CIRCUIT FOR COMPUTATION IN MEMORY

CROSS REFERENCE TO RELATED APPLICATION(S)

This patent application claims the benefit and priority of Chinese Patent Application No. 202110421262.5, filed on Apr. 20, 2021, the disclosure of which is incorporated by reference herein in its entirety as part of the present application.

FIELD OF THE INVENTION

The present disclosure relates to the technical field of computation in memory, and in particular to a logic operation circuit for computation in memory.

BACKGROUND OF THE INVENTION

As computer applications spread to every corner of the world, the amount of data to be processed increases exponentially. In particular, the ability of traditional computing platforms to meet these requirements begins to stagnate fundamentally, which is due to the existing limitations in equipment architecture. In the existing Von Neumann computing platform, the separation of a memory from a computing unit interconnected by a bus faces serious challenges, such as long memory access delay. In order to alleviate these concerns, it is feasible to find a new storage device to replace the traditional memory.

SUMMARY OF THE INVENTION

The purpose of the present disclosure is to provide a logic operation circuit for computation in memory, which reduces the circuit complexity.

To achieve the above purpose, the present disclosure provides the following scheme.

A logic operation circuit for computation in memory, comprising: an equivalent circuit input terminal, a reference circuit input terminal, a reset input terminal, and an output terminal;
wherein the equivalent circuit input terminal is configured to input the equivalent voltage of a memory computing array, the reset input terminal is configured to input a reset voltage, and the reference circuit input terminal is configured to input a reference voltage;
the logic operation circuit for computation in memory outputs different output voltages according to the difference between the equivalent voltage and the reference voltage, and the output voltage is output through the output terminal.

Preferably, the logic operation circuit for computation in memory comprises: a first NOR gate, a second NOR gate, a first inverter and a second inverter; wherein the output terminal comprises a first output terminal and a second output terminal;
wherein a first input terminal of the first NOR gate and a first input terminal of the second NOR gate are both connected to the reset input terminal, a second input terminal of the first NOR gate is connected to the equivalent circuit input terminal, a third input terminal of the first NOR gate is connected to the output terminal of the second NOR gate, a second input terminal of the second NOR gate is connected to the reference circuit input terminal, and a third input terminal of the second NOR gate is connected to the output terminal of the first NOR gate;
an output terminal of the first NOR gate is connected to an input terminal of the first inverter, an output terminal of the first inverter is connected to the first output terminal; an output terminal of the second NOR gate is connected to an input terminal of the second inverter, and an output terminal of the second inverter is connected to the second output terminal.

Preferably, the first inverter and the second inverter have the same structure.

Preferably, the first inverter comprises a first field effect transistor and a second field effect transistor, and the second inverter comprises a third field effect transistor and a fourth field effect transistor;
the gate of the first field effect transistor and the gate of the second field effect transistor are both connected to the output terminal of the first NOR gate, the gate of the third field effect transistor and the gate of the fourth field effect transistor are both connected to the output terminal of the second NOR gate, the second electrode of the third field effect transistor and the first electrode of the fourth field effect transistor are both connected to the second output terminal, the second electrode of the first field effect transistor and the first electrode of the second field effect transistor are both connected to the first output terminal, the second electrode of the second field effect transistor and the second electrode of the fourth field effect transistor are both grounded, and the first electrode of the first field effect transistor and the first electrode of the third field effect transistor are both connected to a power supply.

Preferably, the first field effect transistor and the third field effect transistor are both PMOS transistors.

Preferably, the second field effect transistor and the fourth field effect transistor are both NMOS transistors.

Preferably, the logic operation circuit for computation in memory outputs different output voltages according to the difference between the equivalent voltage and the reference voltage, and the output voltage is output through the output terminal, specifically comprising:
when the reset voltage is at a low potential and the equivalent voltage is greater than the reference voltage, the output terminal outputs a high potential;
when the reset voltage is at a low potential and the equivalent voltage is smaller than the reference voltage, the output terminal outputs a low potential;
the low potential is 0, and the high potential is 1.

Preferably, when the first output terminal outputs a high potential, the second output terminal outputs a low potential; when the first output terminal outputs a low potential, the second output terminal outputs a high potential; the low potential is 0, and the high potential is 1.

According to the specific embodiment provided by the present disclosure, the present disclosure discloses the following technical effects.

The present disclosure discloses a logic operation circuit for computation in memory, which comprises an equivalent circuit input terminal, a reference circuit input terminal, a reset input terminal and an output terminal; wherein the equivalent circuit input terminal is configured to input the equivalent voltage of a memory computing array, the reset input terminal is configured to input a reset voltage, and the reference circuit input terminal is configured to input a reference voltage; the logic operation circuit for computation in memory outputs different output voltages according to the difference between the equivalent voltage and the reference voltage, and the output voltage is output through the output terminal; the logic operation circuit of the present disclosure has a simple structure, reduced complexity and effectively saved resources.

BRIEF DESCRIPTION OF THE DRAWINGS

In order to explain the embodiments of the present disclosure or the technical scheme in the prior art more clearly, the drawings needed in the embodiments will be briefly introduced hereinafter. Obviously, the drawings in the following description are only some embodiments of the present disclosure. For those skilled in the art, other drawings can be obtained according to these drawings without paying creative labor.

DETAILED DESCRIPTION OF THE PREFERRED EMBODIMENT(S)

The technical scheme in the embodiments of the present disclosure will be described clearly and completely hereinafter with reference to the drawings in the embodiments of the present disclosure. Obviously, the described embodiments are only some embodiments of the present disclosure, rather than all of the embodiments. Based on the embodiments of the present disclosure, all other embodiments obtained by those skilled in the art without paying creative labor belong to the scope of protection of the present disclosure.

The purpose of the present disclosure is to provide a logic operation circuit for computation in memory, which reduces the circuit complexity.

In order to make the above objects, features and advantages of the present disclosure more obvious and understandable, the present disclosure will be further explained in detail hereinafter with reference to the drawings and specific embodiments.

Figure 1:
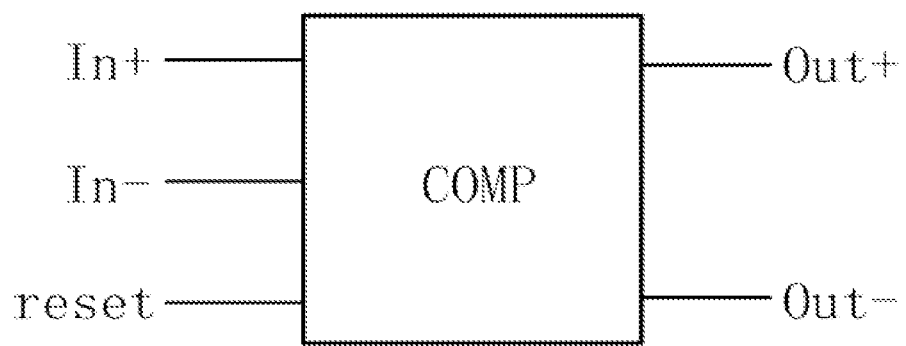
FIG. 1 is a schematic structural diagram of a logic operation circuit for computation in memory according to the present disclosure.
Figure 2:
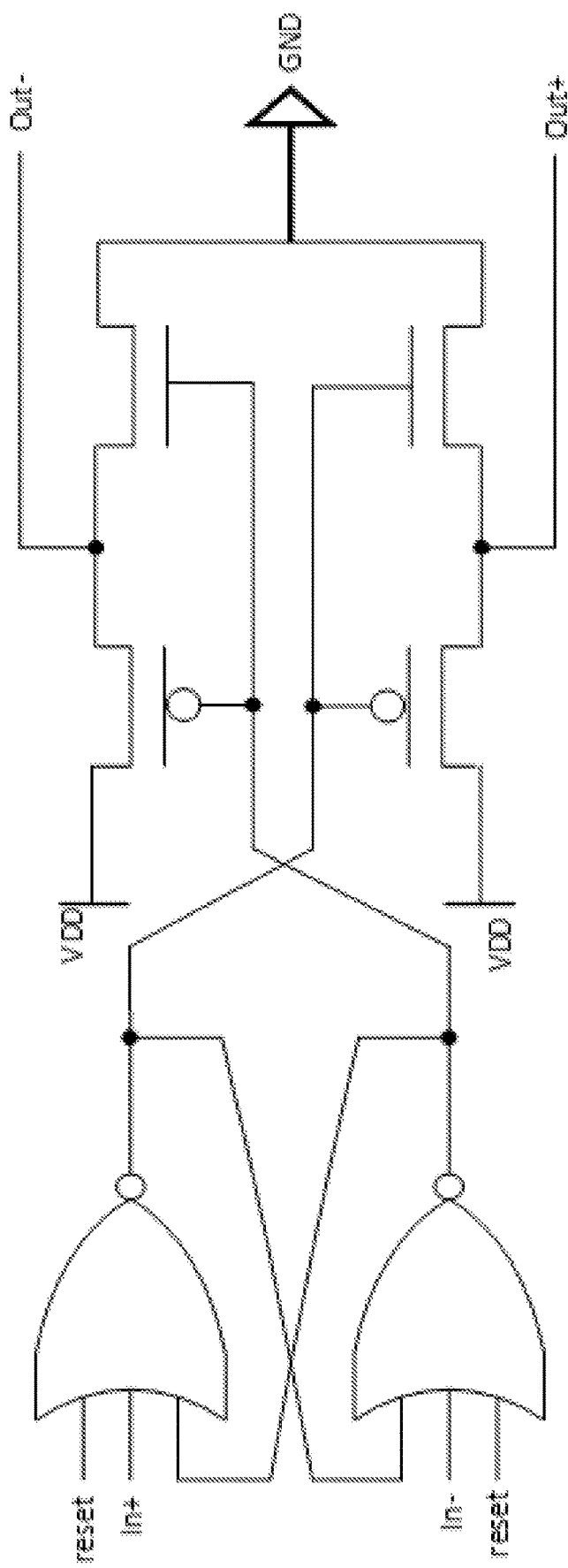
FIG. 2 is a schematic diagram illustrating the detailed structure of a logic operation circuit for computation in memory according to the present disclosure.

FIG. 1 is a schematic structural diagram of a logic operation circuit for computation in memory according to the present disclosure, and FIG. 2 is a schematic diagram illustrating the detailed structure of a logic operation circuit for computation in memory according to the present disclosure. As shown in FIGS. 1-2, a logic operation circuit (COMP) for computation in memory comprises an equivalent circuit input terminal In+, a reference circuit input terminal In—, a reset input terminal reset and an output terminal.

The equivalent circuit input terminal In+ is configured to input the equivalent voltage of a memory computing array, the reset input terminal reset is configured to input a reset voltage, and the reference circuit input terminal In— is configured to input a reference voltage.

The logic operation circuit for computation in memory outputs different output voltages according to the difference between the equivalent voltage and the reference voltage, and the output voltage is output through the output terminal.

The logic operation circuit for computation in memory comprises a first NOR gate, a second NOR gate, a first inverter and a second inverter. The output terminal comprises a first output terminal Out+ and a second output terminal Out−.

A first input terminal of the first NOR gate and a first input terminal of the second NOR gate are both connected to the reset input terminal reset, a second input terminal of the first NOR gate is connected to the equivalent circuit input terminal In+, a third input terminal of the first NOR gate is connected to the output terminal of the second NOR gate, a second input terminal of the second NOR gate is connected to the reference circuit input terminal In−, and a third input terminal of the second NOR gate is connected to the output terminal of the first NOR gate.

An output terminal of the first NOR gate is connected to an input terminal of the first inverter, an output terminal of the first inverter is connected to the first output terminal Out+; an output terminal of the second NOR gate is connected to an input terminal of the second inverter, and an output terminal of the second inverter is connected to the second output terminal Out−.

The first inverter and the second inverter have the same structure.

The first inverter comprises a first field effect transistor and a second field effect transistor, and the second inverter comprises a third field effect transistor and a fourth field effect transistor.

The gate of the first field effect transistor and the gate of the second field effect transistor are both connected to the output terminal of the first NOR gate, the gate of the third field effect transistor and the gate of the fourth field effect transistor are both connected to the output terminal of the second NOR gate, the second electrode of the third field effect transistor and the first electrode of the fourth field effect transistor are both connected to the second output terminal Out−, the second electrode of the first field effect transistor and the first electrode of the second field effect transistor are both connected to the first output terminal Out+, the second electrode of the second field effect transistor and the second electrode of the fourth field effect transistor are both grounded, and the first electrode of the first field effect transistor and the first electrode of the third field effect transistor are both connected to a power supply VDD.

The first field effect transistor and the third field effect transistor are both PMOS transistors.

The second field effect transistor and the fourth field effect transistor are both NMOS transistors.

The logic operation circuit for computation in memory outputs different output voltages according to the difference between the equivalent voltage and the reference voltage, and the output voltage is output through the output terminal, specifically comprising:

when the reset voltage is at a low potential and the equivalent voltage is greater than the reference voltage, the output terminal outputs a high potential;

when the reset voltage is at a low potential and the equivalent voltage is smaller than the reference voltage, the output terminal outputs a low potential;

the low potential is 0, and the high potential is 1.

When the first output terminal Out+ outputs a high potential, the second output terminal Out− outputs a low potential; when the first output terminal Out+ outputs a low potential, the second output terminal Out− outputs a high potential; the low potential is 0, and the high potential is 1.

Next, a logic operation circuit for computation in memory of the present disclosure will be described in detail.

A resistive memory is one of the memories. The resistive memory is often used in the calculation of storage electronic circuits. Therefore, an application and storage computing framework of a nonvolatile resistor is proposed. In this structure, a sense amplifier is usually used for read operation and logic operation.

The present disclosure provides a new logic operation circuit for computation in memory, which can replace the detection amplification circuit. Compared with the original sense amplifier circuit, this circuit has a simple structure and a small circuit area.

The logic operation circuit for computation in memory according to the present disclosure has a framework shown in FIG. 1, and the logic operation circuit for computation in memory has a structure of three inputs and two outputs. The logic operation circuit for computation in memory comprises 16 transistors.

The logic operation circuit for computation in memory comprises a primary circuit and a secondary circuit. The primary circuit is mainly consisted of two three-input NOR gates, the output of which is respectively input to the next stage and the input of another NOR gate. The secondary circuit is consisted of two inverters, in which the input of the inverter is connected to the output of the circuit of the previous stage, and the output of the inverter is the output result of logic operation. The logic operation circuit is mainly used for computation in memory. The input of the equivalent circuit of the computation in memory array is input from the In+ terminal (the equivalent circuit input terminal) of the primary circuit, and the input of the reference circuit is input from the other end In— (the reference circuit input terminal). Because of the different input voltages, the equivalent circuit and the reference circuit have different outputs.

The specific working principle of the logic operation circuit for computation in memory is as follows: the input ports are three inputs, which are the equivalent circuit input, the reference circuit input and the reset input of a memory cell. The resistance value of the reference circuit has been set at the time of circuit design. When the circuit starts to work, the reset input (reset input terminal) is always kept high, so that the circuit always keeps a set state. At this time, both outputs of the circuit are high, and the circuit has not yet entered the calculation state. Because the stable input of the reference circuit and the input of the equivalent circuit in the array (the memory computing array) have different delay times, the arrival times at the input port are different. When the signal is not stable, the comparison result will be wrong during comparison. Therefore, when the circuit starts to work, it is necessary to keep the potential in a set state all the time. As shown in FIG. 2: the input terminal reset is set to a high potential. Because one input signal reset at the input terminal always remains at a high potential, no matter whether the other signals at the input terminal are at a high or low potential, the output of the NOR gate is at a low potential after passing through the three-input NOR gate, and then one inverter of the secondary circuit outputs a high potential. At this time, the two output terminals Out+(the first output terminal) and Out− (the second output terminal) are both at a high potential, and the logic operation circuit remains in a set state. After the input is stable, the reset input remains low. At this time, the logic operation circuit enters the calculation state, the reset input remains low, and In+ and In− are connected to the output voltages of the equivalent circuit and the reference circuit of the array, respectively. At this time, the ports In+ and In− will compete with each other due to different input voltages. The port with a high input port voltage will be successful. Assuming that the input voltage at the input terminal In+ is higher than that at In−, the NAND gate with input In+ outputs a low voltage, and outputs a high voltage at the Out+ terminal after passing through the inverter of the secondary circuit. The other output terminal Out− outputs a low voltage. This characteristic is used to realize the logical operation in the integration of storage and calculation.

Figures 3, 4:
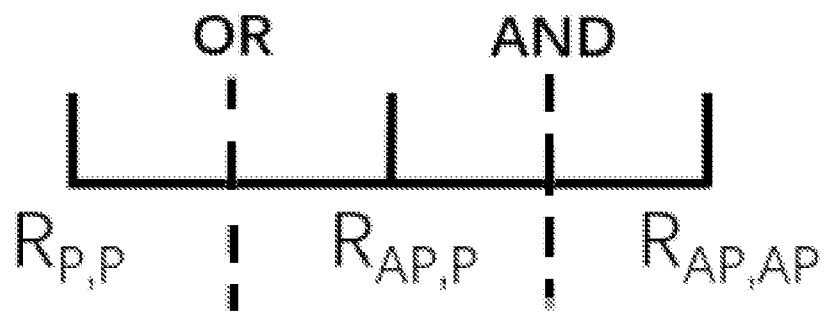
FIG. 3 is a schematic diagram of resistance selection of a reference circuit according to the present disclosure.
FIG. 4 is a truth table of AND logic and OR logic according to the present disclosure.
Figure 5:
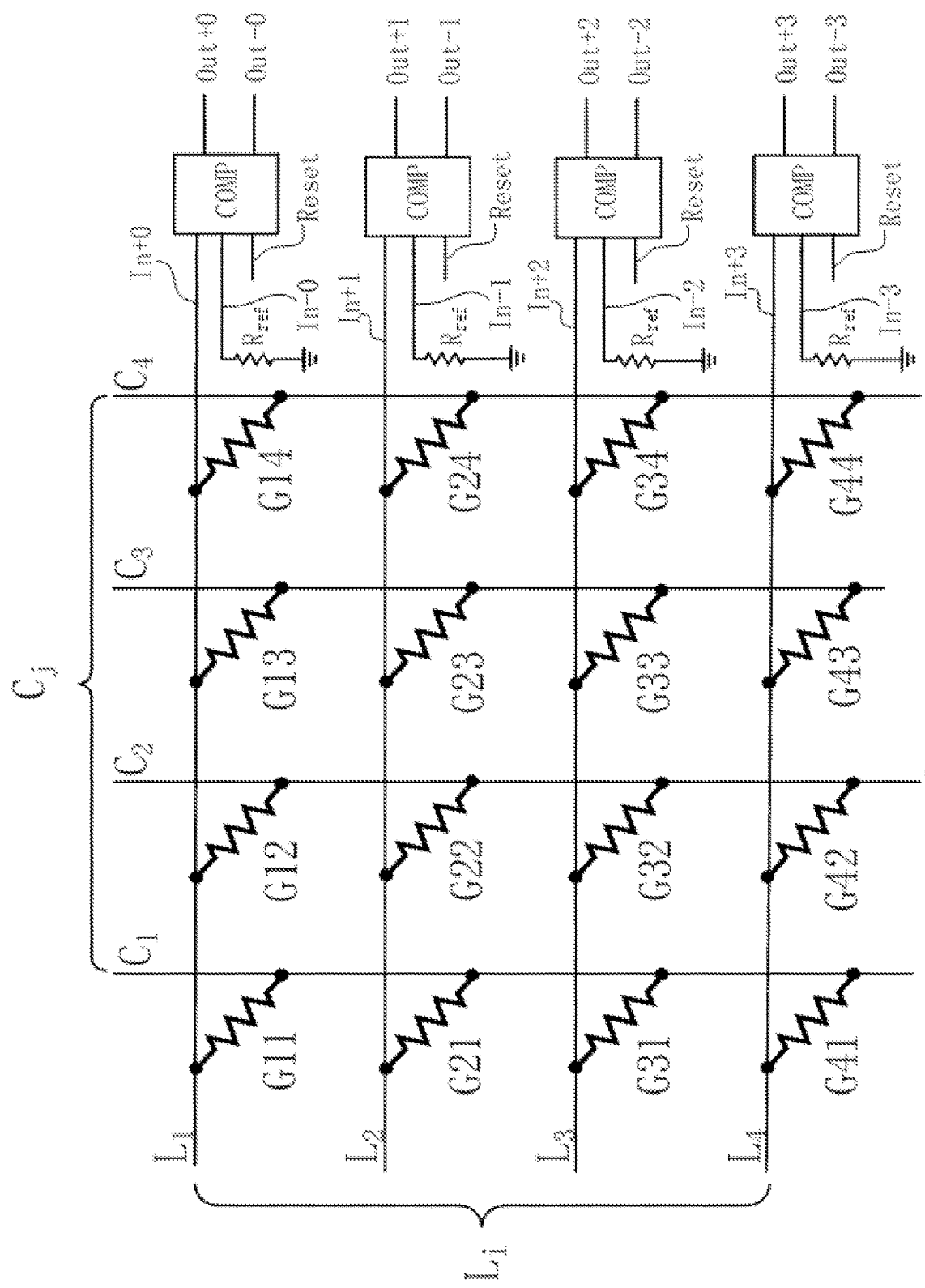
FIG. 5 is a schematic diagram of an application structure of a logic operation circuit for computation in memory according to the present disclosure.

Introduction of a logic operation circuit for computation in memory: the input In+0 is the equivalent resistance of the array, and the resistance value of the array using a nonvolatile memory is related to the writing of its voltage. As shown in FIG. 5: $L_i$ and $C_j$ are row and column control. respectively, $G_{11}$, $G_{12}$ and $G_{13}$ are the equivalent conductance of each memory cell respectively. If the stored data is a high impedance, which represents "1" in the logic circuit, the high impedance value is set as $R_{AP}$. If the stored resistance value is a low impedance, which represents "0" in the logic circuit, the low resistance value is set as $R_P$. FIG. 5 comprises four logic operation circuits for computation in memory. The input terminals of the equivalent circuit of four logic operation circuits are denoted as In+0, In+1, In+2 and In+3, respectively, the input terminals of the reference circuit are denoted as In−0, In−1, In−2 and In−3, respectively, the first output terminals are denoted as Out+0, Out+1, Out+2 and Out+3, respectively, and the second output terminals are denoted as Out−0, Out−1, Out−2 and Out−3, respectively. Two or more cells are selected at the same time by the on/off of the row and column control $L_i$ and $C_j$ in the overall circuit shown in FIG. 5. Assuming that $L_i$ and $C_j$ are selected, $G_{11}$ cell in the figure is selected. Assuming that $L_1$, $C_1$ and $C_2$ are made high at the same time, $G_{11}$ and $G_{12}$ cells in the figure are selected at the same time. When logic operation is performed, two cells are selected at the same time. The equivalent resistance of the selected cells is compared with the equivalent resistance set in advance. When two cells are selected, there may be three combinations of values: $R_{P,P}$, $R_{AP,P}(R_{P,AP})$ and $R_{AP,AP}$ (representing the resistance values stored in the selected two memory cells as three combinations of low resistance, low resistance, or high resistance, low resistance, or high resistance, high low resistance). The middle value of these three combinations can be the set reference value, and the logic operation can be realized in the reference value interval as shown in FIG. 3. When the reference value is selected as the middle value of parallel values ($R_{P,P}$) with two cells as low resistance and parallel values ($R_{AP,P}$) with two cells as high resistance and low resistance respectively, that is, the reference value (voltage value input at the input terminal of the reference circuit) is between $R_{P,P}$ and $R_{AP,P}$, OR operation can be completed. When the reference value is selected as the middle value of the parallel value ($R_{AP,AP}$) with two cells as high resistance and the parallel value ($R_{AP,P}$) with two cells as high resistance and low resistance, that is, the reference value (voltage value input at the input terminal of the reference circuit) is between $R_{AP,AP}$ and $R_{AP}$, AND operation can be completed. The reference circuit is selected as the circuit to complete the AND operation. The specific operation mode is as follows: when the two selected units are both high resistances, their output voltages are $V_{AP,AP}$ (the voltage output when the information stored by the two selected units is high resistance at the same time). At this time, the voltage value of the comparison unit (reference value $R_{ref}$) is small, and the output level is a high level. When the selected units are high resistance and low resistance, the output voltage is $V_{AP,P}$ (the voltage output when the information stored by the two selected units is high resistance and low resistance). At this time, the voltage value of the comparison unit is large, and the output level is a low level. When the selected units are low resistance, the output voltage is $V_{P,P}$ (the voltage output when the information stored by the two selected units is low resistance at the same time). At this time, the voltage value of the comparison unit is large, and the output level is a low level. It can be concluded from the truth table in FIG. 4 that the AND operation in the logic operation can be completed, and similarly, the OR operation can also be completed.

When the two input voltages reach a stable state, the reset input terminal is pulled low, and the circuit enters a calculation state at this time. By calculating the output of the circuit, the outputs of OR logic and NOR logic can be obtained. Similarly, the outputs of AND logic and NAND logic can be realized by using different reference resistors $R_{ref}$.

The operation circuit disclosed by the present disclosure has the following beneficial effects.

The calculation circuit for computation in memory disclosed by the present disclosure are all devices using standard cell libraries, and can better adapt to the traditional EDA (Electronic design automation) design flow.

According to the scale of the logic operation circuit for computation in memory proposed by the present disclosure, compared with the traditional comparison circuit based on an operational amplifier, the design of the novel calculation circuit proposed by the present disclosure is very simple, the number of transistors used is reduced by more than half, and the circuit complexity is greatly reduced.

The logic operation circuit for computation in memory provided by the present disclosure can be widely applied to the operation circuit required for computation in memory, and the time required for integrated operation of storage and calculation is reduced.

The logic operation circuit for computation in memory provided by the present disclosure can directly compare signals with very small difference of input signals without amplifying and then comparing the signals, thus effectively saving resources.

In this specification, each embodiment is described in a progressive manner, and each embodiment focuses on the differences from other embodiments. It is sufficient to refer to the same and similar parts among each embodiment.

In the present disclosure, a specific example is applied to illustrate the principle and implementation of the present disclosure, and the explanation of the above embodiments is only used to help understand the method and its core idea of the present disclosure. At the same time, according to the idea of the present disclosure, there will be some changes in the specific implementation and application scope for those skilled in the art. To sum up, the contents of this specification should not be construed as limiting the present disclosure.

What is claimed is:

1. A logic operation circuit for computation in memory, comprising: an equivalent circuit input terminal, a reference circuit input terminal, a reset input terminal and an output terminal;

wherein the equivalent circuit input terminal is configured to input the equivalent voltage of a memory computing array, the reset input terminal is configured to input a reset voltage, and the reference circuit input terminal is configured to input a reference voltage;

the logic operation circuit for computation in memory outputs different output voltages according to the difference between the equivalent voltage and the reference voltage, and the output voltage is output through the output terminal;

wherein the logic operation circuit for computation in memory further comprises: a first NOR gate, a second NOR gate, a first inverter and a second inverter; wherein the output terminal comprises a first output terminal and a second output terminal;

wherein a first input terminal of the first NOR gate and a first input terminal of the second NOR gate are both connected to the reset input terminal, a second input terminal of the first NOR gate is connected to the equivalent circuit input terminal, a third input terminal of the first NOR gate is connected to the output terminal of the second NOR gate, a second input terminal of the second NOR gate is connected to the reference circuit input terminal, and a third input terminal of the second NOR gate is connected to the output terminal of the first NOR gate;

an output terminal of the first NOR gate is connected to an input terminal of the first inverter, an output terminal of the first inverter is connected to the first output terminal; an output terminal of the second NOR gate is connected to an input terminal of the second inverter, and an output terminal of the second inverter is connected to the second output terminal;

wherein when the reset input terminal is set to a high potential, the first output terminal and the second output terminal are both at a high potential, and the logic operation circuit for computation in memory keeps in a set state; when the reset input terminal remains at a low potential, the logic operation circuit for computation in memory enters a calculation state.

2. The logic operation circuit for computation in memory according to claim 1, wherein the first inverter and the second inverter have the same structure.

3. The logic operation circuit for computation in memory according to claim 2, wherein the first inverter comprises a first field effect transistor and a second field effect transistor, and the second inverter comprises a third field effect transistor and a fourth field effect transistor;

the gate of the first field effect transistor and the gate of the second field effect transistor are both connected to the output terminal of the first NOR gate, the gate of the third field effect transistor and the gate of the fourth field effect transistor are both connected to the output terminal of the second NOR gate, the second electrode of the third field effect transistor and the first electrode of the fourth field effect transistor are both connected to the second output terminal, the second electrode of the first field effect transistor and the first electrode of the second field effect transistor are both connected to the first output terminal, the second electrode of the second field effect transistor and the second electrode of the fourth field effect transistor are both grounded, and the first electrode of the first field effect transistor and the first electrode of the third field effect transistor are both connected to a power supply.

4. The logic operation circuit for computation in memory according to claim 3, wherein the first field effect transistor and the third field effect transistor are both PMOS transistors.

5. The logic operation circuit for computation in memory according to claim 3, wherein the second field effect transistor and the fourth field effect transistor are both NMOS transistors.

6. The logic operation circuit for computation in memory according to claim 1, wherein the logic operation circuit for computation in memory outputs different output voltages according to the difference between the equivalent voltage and the reference voltage, and the output voltage is output through the output terminal, specifically comprising:
when the reset voltage is at a low potential and the equivalent voltage is greater than the reference voltage, the output terminal outputs a high potential;
when the reset voltage is at a low potential and the equivalent voltage is smaller than the reference voltage, the output terminal outputs a low potential;
the low potential is 0, and the high potential is 1.

* * * * *